United States Patent [19]
Ellis

[11] Patent Number: 5,818,088
[45] Date of Patent: Oct. 6, 1998

[54] ELECTROSTATIC DISCHARGE PROTECTION NETWORK AND METHOD

[75] Inventor: Denis Ellis, Dooradoyle, Ireland

[73] Assignee: Analog Devices, Inc., Norwood, Mass.

[21] Appl. No.: 872,312

[22] Filed: Jun. 10, 1997

Related U.S. Application Data

[63] Continuation of Ser. No. 526,602, Sep. 11, 1995, abandoned.

[51] Int. Cl.[6] .................................................. H01L 23/62
[52] U.S. Cl. .......................... 257/355; 257/361; 257/362
[58] Field of Search ............................. 257/355–7, 360–2

[56] References Cited

U.S. PATENT DOCUMENTS

| | | | |
|---|---|---|---|
| 4,100,561 | 7/1978 | Ollendorf | 257/362 |
| 4,477,736 | 10/1984 | Onishi | 257/312 |
| 4,875,130 | 10/1989 | Huard | 257/362 |
| 4,876,584 | 10/1989 | Taylor | 357/23.13 |
| 4,924,339 | 5/1990 | Atsumi et al. | 361/56 |
| 4,994,874 | 2/1991 | Shimizu et al. | 357/23.13 |
| 5,027,252 | 6/1991 | Yamamura | 361/58 |
| 5,079,612 | 1/1992 | Takamoto et al. | 357/41 |
| 5,158,899 | 10/1992 | Yamagata | 257/362 |
| 5,195,010 | 3/1993 | Dresner | 361/56 |
| 5,196,913 | 3/1993 | Kim et al. | 357/23.13 |
| 5,218,222 | 6/1993 | Roberts | 257/362 |
| 5,290,724 | 3/1994 | Leach | 257/360 |
| 5,291,051 | 3/1994 | Hoang et al. | 257/361 |
| 5,293,057 | 3/1994 | Ho et al. | 257/356 |
| 5,301,084 | 4/1994 | Miller | 361/91 |
| 5,329,143 | 7/1994 | Tsiu et al. | 257/173 |
| 5,336,908 | 8/1994 | Roberts | 257/173 |

FOREIGN PATENT DOCUMENTS

| | | | |
|---|---|---|---|
| 0042581 | 12/1981 | European Pat. Off. | 257/362 |
| 57-7151 | 1/1982 | Japan | 257/362 |
| 4-30579 | 2/1992 | Japan | 257/362 |

*Primary Examiner*—J. Carroll
*Attorney, Agent, or Firm*—Koppel & Jacobs

[57] ABSTRACT

An ESD protection network (20) provides energy discharge paths for an ESD event at an external circuit port (42). The paths include one portion (28) into an integrated circuit substrate (72) and other portions (29, 30) from the substrate to external power supply ports (43, 44). In particular, these paths include energy discharge routes around on-circuit voltage sources.

18 Claims, 3 Drawing Sheets

ELECTROSTATIC DISCHARGE PROTECTION NETWORK AND METHOD

This is a continuation of application Ser. No. 08/526,602, filed on Sep. 11, 1995, abandoned.

BACKGROUND OF THE INVENTION

1. Field Of The Invention

The present invention relates generally to electrostatic discharge and more particularly to electrostatic-discharge protection networks.

2. Description Of The Related Art

The source of electrostatic discharge (ESD) is static electricity which can build up high charges of voltage on paper, plastic and other nonconductors. Catastrophic damage can occur if this voltage charge is inadvertently coupled to the input/output terminals of electronic circuits. Complimentary metal oxide silicon (CMOS) integrated circuits are especially vulnerable to ESD.

In these circuits, metal oxide semiconductor (MOS) devices typically have a thin, closely controlled layer of $SiO_2$ which is thermally grown over a substrate. This thin layer is called the "gate oxide". Silicon is then deposited over the gate oxide to form a polysilicon gate. The polysilicon gate is used as a mask and the source and drain regions are either diffused or ion-implanted on each side of the gate. Input/output terminals to a CMOS circuit may couple directly to MOS device gates, and because the gate oxide layer is extremely thin, e.g., 100–200 Å, it is particularly sensitive to destruction by high voltage and/or thermal vaporization.

Vulnerable circuit components also include thin film resistors if they are in a position where they can receive a static discharge. For example, a thin film resistor with a specified resistance may be placed across an external signal port to set the input impedance that is required by an electronic interface standard, e.g., the RS-232C standard. As indicated by their name, thin film resistors are typically formed of a thin film of a resistive alloy, e.g., gold-platinum or nickel-chromium, that is deposited, e.g., by vacuum deposition or sputtering, onto a surface. The thin film can then be trimmed, e.g., with a laser, to a specified resistance. Although their small size, temperature stability and fabrication techniques make thin film resistors especially suitable for use in CMOS integrated circuits, they have a limited ability to carry current because of their construction. Accordingly, they are particularly sensitive to static discharge.

ESD protection standards have evolved various tests based on ESD "models". These models are designed to simulate electrostatic conditions that a circuit might be subjected to in the real world. These models include the human body model (HBM) which is described in MIL Standard 883-C. It is designed to simulate the electrostatic discharge which can result from contact with a human being. In this module, a 100 picofarad capacitor is charged to a high voltage, e.g., 1000 volts. The capacitor is then discharged into a test circuit through a series circuit of a 1500 ohm resistor. The discharge current falls exponentially with a time constant of 150 nanoseconds.

A machine model (MM) is based on a worst-case HBM. In this model (also known as the Japanese model), a 200 picofarad capacitor is charged to a lesser voltage, e.g., 200 volts but it is then discharged into the test circuit through a series circuit of a 500 nanohenry inductor. Although the response is dependent upon the test load, this generally results in a rapid voltage rise followed by a damped oscillation. Peak discharge current can be quite high because there is no current-limiting resistance.

Finally, a charged device model (CDM) is intended to simulate the discharge that occurs when an integrated circuit pin at one potential contacts a conductive surface at a different potential, e.g., ground. In this model, a 1-20 picofarad capacitor is discharged into the test circuit through a series circuit of a one ohm resistor. The response is a voltage and current spike.

Typical ESD protection devices include parasitic substrate transistors (e.g., U.S. Pat. No. 5,301,084), "punch-through" transistors (e.g., U.S. Pat. Nos. 4,876,584 and 5,027,252), floating-base bipolar transistor clamps (e.g., U.S. Pat. Nos. 4,924,339, 4,994,874, 5,079,612, 5,196,913, 5,218,222, 5,293,057 and 5,329,143), fusing devices (e.g., U.S. Pat. No. 5,195,010) and silicon controlled rectifiers (e.g., U.S. Pat. 5,336,908).

Although these protective devices are directed to the creation of low-impedance paths for the safe discharge of ESD events, they generally have not addressed circuits which include an on-circuit voltage generator. The circuit substrate is often reverse biased by the output of such a generator, and the substrate may therefore not be able to complete a safe discharge path.

SUMMARY OF THE INVENTION

The present invention is directed to an electrostatic discharge protection network that provides safe energy discharge paths to external circuit ports. The invention addresses the presence of circuit elements, e.g., on-circuit voltage generators, that may block the completion of the discharge path.

This goal is achieved by the recognition that a discharge path having one portion into an integrated circuit substrate must be accompanied by other portions that can complete a path through the source of the ESD event. This generally requires the creation of path portions between the substrate and external voltage supply ports.

An embodiment of the invention is directed to the protection of a circuit from bipolar electrostatic discharges at an external port in which the circuit has first and second voltage supply ports for the application of a first supply voltage, a voltage generator coupled to the first voltage supply port for generating a second supply voltage at a generator output, and a semiconductor substrate coupled to the generator output for biasing the substrate.

The embodiment includes a bipolar junction transistor which is positioned in the substrate with its emitter coupled to the external port, its open-circuited base positioned between the emitter and the substrate, and its collector arranged to surround the base. The collector is preferably separated from the base by a space which is selected to obtain a predetermined breakdown voltage between the collector and the base. The embodiment preferably includes a first MOS transistor positioned in the substrate and arranged to provide a conduction path between the substrate and the first voltage supply port, and a second MOS transistor positioned in the substrate and arranged to provide a conduction path between the substrate and the second supply port. A third MOS transistor may be positioned in the substrate and arranged to provide a conduction path between the first and second voltage supply ports.

Desired breakdown voltages in these protection elements can be obtained by selection of the space between the collector and base and by selection of semiconductor doping concentration levels.

In another embodiment, the first and second MOS transistors are replaced by diodes and the third MOS transistor is replaced by a bipolar transistor.

The novel features of the invention are set forth with particularity in the appended claims. The invention will be best understood from the following description when read in conjunction with the accompanying drawings.

DESCRIPTION OF THE PREFERRED EMBODIMENTS

Figure 1:
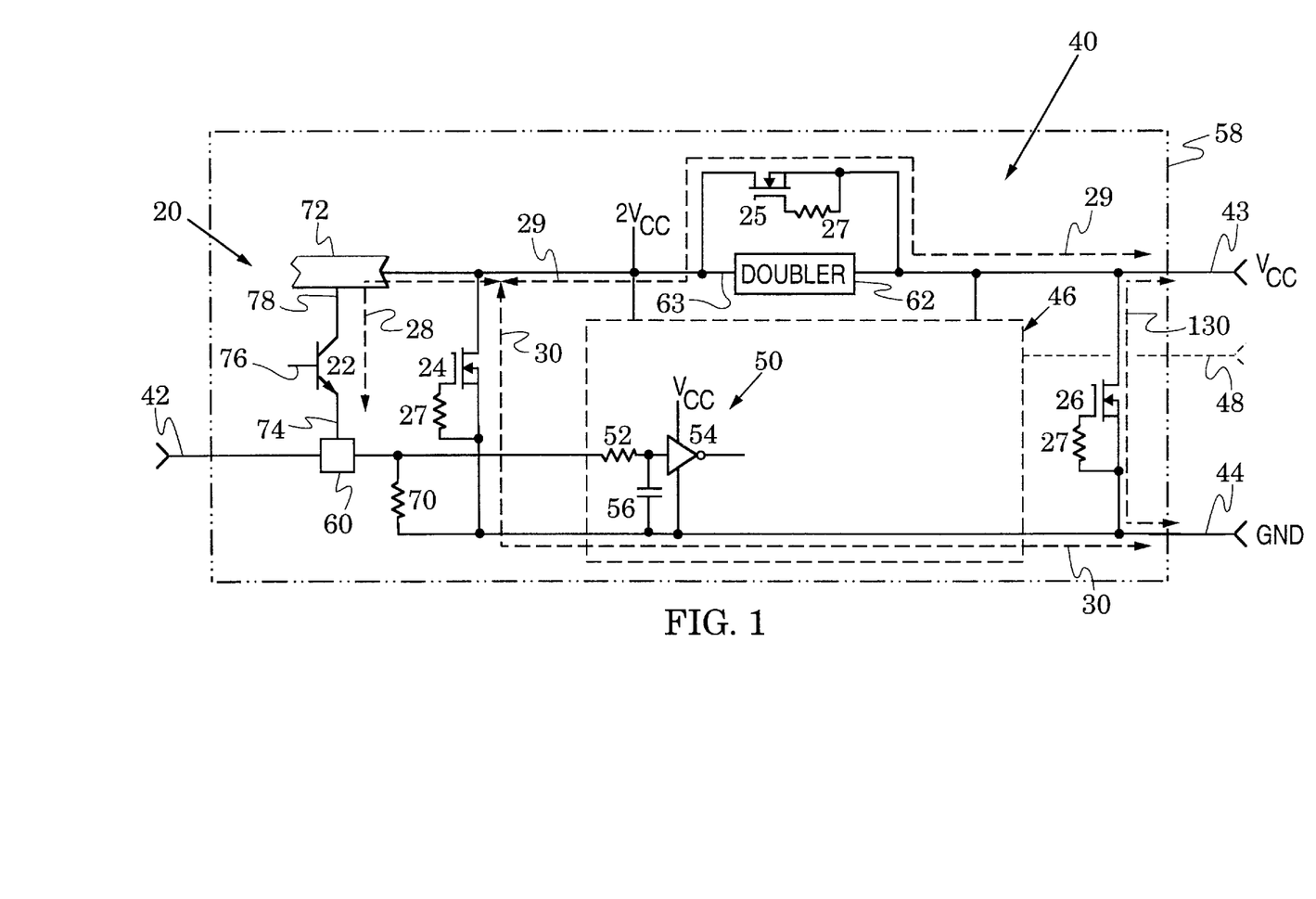
FIG. 1 is a schematic of an integrated circuit which includes an ESD protection/network in accordance with the present invention.

As shown in FIG. 1, a protection network 20 in accordance with the present invention is included in an integrated circuit 40 to protect the circuit from bipolar electrostatic discharges at an external port 42 of the integrated circuit. The protection network 20 includes a bipolar junction transistor 22, a first MOS transistor 24, a second MOS transistor 25 and a third MOS transistor 26. Each of the MOS transistors has its gate and source connected through respective resistors 27 and each has its substrate (often called the "backgate") connected to its source.

The network 20 provides conduction paths 28, 29, 30 and 130 (shown by broken lines in FIG. 1) for the safe conduction of electrostatic discharge energy from the external port 42. In accordance with a feature of the invention, these paths include path portions into an integrated circuit substrate and, in addition, path portions that reach the external voltage supply ports 43 and 44.

A detailed description of the concept and operation of the protection network 20 will be preceded by the following description of the integrated circuit 40. The integrated circuit 40 includes a circuit 46 which is conventionally realized on an integrated circuit. The circuit 46 typically has operational ports such as the port 48 which is shown in broken lines. The details of the circuit 46 and its port 48 are not essential to a description of the invention and are therefore not shown for clarity of illustration.

The circuit 46 also includes an interface buffer 50 which includes a series resistor 52, an inverter 54 and a shunt capacitor 56. The resistor 52 connects the external port 42 with the inverter 54 and the shunt capacitor 56 is positioned between the resistor 52 and the inverter 54. The integrated circuit 40 also includes an environmental enclosure 58, and the circuit ports 42, 43, 44 and 48 are typically coupled to pads on the integrated circuit. In particular, the external port 42 is coupled to a pad 60.

The integrated circuit 40 is designed to operate with two positive voltages which have the values of $V_{CC}$ and $2V_{CC}$. The voltage $V_{CC}$ is supplied at the first voltage supply port 43 and $2V_{CC}$ is generated from $V_{CC}$ with a voltage generator in the form of a doubler 62. In the exemplary circuit 40, the voltage $2V_{CC}$ appears at the generator output 63 and the voltages $V_{CC}$ and $2V_{CC}$ are referenced to ground (GND) at the second voltage supply port 44.

The integrated circuit 40 belongs to a class of circuits that are intended to operate in accordance with the RS-232C interface standard. This is a defacto industry standard for connecting devices which include computers, printers, crt displays, teletypewriters, modems and test equipment. This standard includes various specifications of plus and minus digital data levels. For example, in an exemplary RS-232C specification, a digital one is defined as +3 to +9 volts and a digital zero is defined as −3 to −9 volts. In another specification, a digital one is defined as +5 to +25 volts and a digital zero is defined as −5 to −25 volts. The RS-232C standard also specifies a range of digital data rates and, of most relevance to the present invention, it defines a standard, external-port, interface impedance to be less than 5 kilohms.

This impedance requirement is satisfied in the integrated circuit 40 with a 5 kilohm resistor 70 which is placed across the input of the buffer 50. Because the voltage supply port 44 is at ground, the resistor 70 is positioned between the pad 60 and the port 44.

In practical interface circuits, the digital data is usually accompanied by noise. Therefore, the resistor 52 and the shunt capacitor 56 are selected to have values, e.g., 100 kilohms and 4 picofarad, which form a low-pass filter that removes a significant portion of the interface noise while still being consistent with the standard's specified data-rate reception range.

In integrated circuites, resistors are conventionally deposited as a thin film which is limited in its ability to dissipate power. Application of the currents and energies of the ESD models, e.g., the HBM, to the external port 42 would typically vaporize the resistor 70. Accordingly, the protection network 20 provides the low-resistance paths 28, 29 and 30 which allow ESD energy that is introduced at the external port 42 to be safely conducted around the resistor 70. The paths 28, 29 and 30 are indicated by double-headed arrows to indicate energy flow in both directions in response to positive and negative ESD events. Energy in the path 28 is typically directed along a selected one of the paths 29 and 30, the selection being dictated by the polarity of the event.

Figures 2, 3, 4:
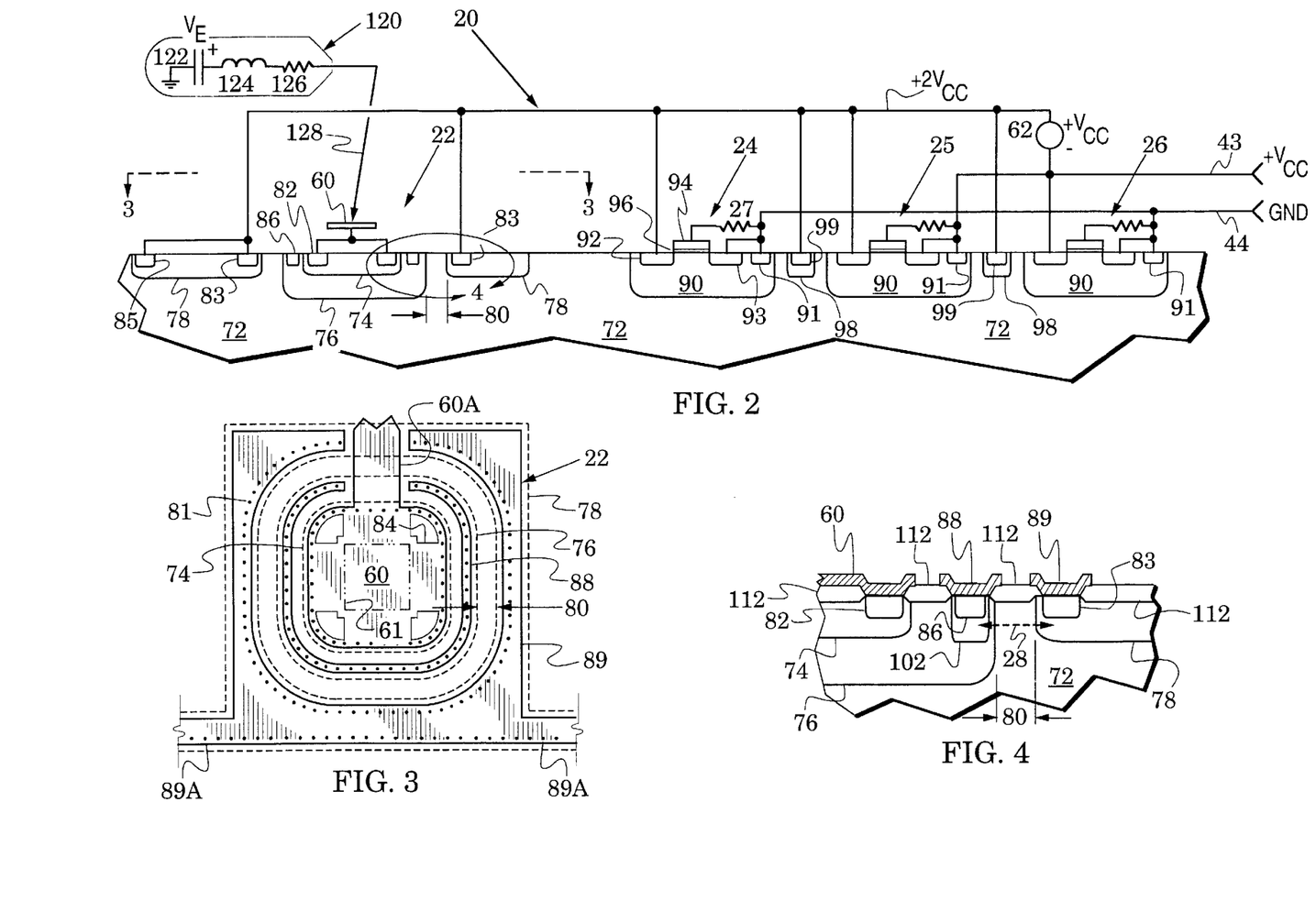
FIG. 2 is a sectional view of an integrated circuit which realizes the ESD protection network of FIG. 1.
FIG. 3 is a reduced view along the plane 3—3 of FIG. 2.
FIG. 4 is an enlarged view of the structure within the curved line 4 of FIG. 2.

The protection network 20 can be best described with reference to its structure in the integrated circuit 40. Thus, FIGS. 2–4 illustrate the integrated circuit structure of the protection network 20 as it is formed in the integrated circui's substrate 72. The invention is not limited to the semiconductor-type of the substrate 72, but the substrate is assumed for illustrative purposes to be an n-type semiconductor. The pad 60 is deposited over an n-type emitter 74 of the bipolar junction transistor 22 (the pad is spaced from the emitter in FIG. 2 for clarity of illustration). A open-circuited, p-type base 76 is positioned between the emitter 74 and the substrate 72. An n-type collector 78 is arranged to surround the base 76. Although the collector 78 may be arranged to abut the base 76, it is preferably spaced from the base by a space 80.

An ohmic contact is formed between the pad 60 and the emitter 74 with the aid of a ring-shaped region 82 which is doped to be $n^{++}$ (i.e., highly doped). Metal, e.g., gold, is deposited over the emitter 74 and arranged to contact the ring-shaped region 82. This metal member forms the pad 60.

A $p^{++}$ ring-shaped region 86 is formed in the base 76 to surround the emitter 74 and a metal ring 88 is deposited to contact this ring-shaped region and form an ohmic contact.

An $n^{++}$ring-shaped region 83 is formed in the collector 78 to surround the base 76 and a metal member 89 is deposited to contact this ring-shaped region to form another ohmic contact. These ring-shaped ohmic contacts facilitate current spreading in the transistor 22 and help to avoid current crowding which can lead to heating failures.

As shown in FIG. 3, the pad 60 includes an extension 60A which extends radially through a break in the member 89 to connect with other circuit elements, e.g., the resistor 70, as indicated in the schematic of FIG. 1. The member 89 also has an extension 89A which forms a guard ring that encircles the integrated circuit 40 for isolation purposes, e.g., to prevent latchup through parasitic transistors and serve as a moisture guard. An $n^{++}$ohmic contact region 85 (see FIG. 2) is formed underneath the extension 89A. To facilitate their fabrication, the ohmic contact regions 82, 83, 85, and 86 are preferably formed in intermittent contact points 81 as indicated in FIG. 3. The pad 60 is has cutouts 84 to aid in pattern recognition. The integrated circuit 40 is typically covered with a protective passivation layer. A window 61 is opened in this layor to expose the pad 60.

Preferably, the discharge current through the transistor 22 is equally shared by all portions of the device. Therefore, in addition to the continuous-loop ohmic contacts, the elements of the transistor 22 are preferably arranged to avoid the definition of sharp corners as particularly shown in the plan view of FIG. 3. In the extreme, sharp corners can be avoided by causing the transistor elements to have a completely circular shape in the plan view. Sharp corners are to be avoided in the transistor's configuration because they tend to concentrate currents and power dissipation. The low impedance of the ohmic contacts 82, 83, 85 and 86 and the surface metallization members 87, 88 and 89 also helps to spread currents and power dissipation throughout the transistor 22.

Each of the MOS transistors 24, 25 and 26 is formed in a respective p-well 90, i.e., a well that is formed in the substrate and doped to be p-type. Each p-well (backgate) has a respective $p^{++}$ohmic contact 91. Exemplary of the other MOS transistors, the MOS transistor 24 has an n-type drain 92, an n-type source 93 and a gate 94 that is separated from the p-well 90 by a thin gate oxide 96. The transistors 24, 25 and 26 are isolated from each other by n-type channel stops 98. These are n-type regions which penetrate deeply enough into the substrate 72 to block lateral current flows (such isolation regions are typically called channel stops because they are often used to limit and isolate MOS channels). Contact to each channel stop 98 is enhanced by an $n^{++}$ohmic contact region 99.

The structure of the transistor 22 is often referred to as a "lateral transistor" because current flow is generally parallel to the surface of the substrate 72. Because of the lateral nature of current flow throughout the structure of FIG. 2, the base 76 preferably also includes a $p^+$channel stop 102 surrounding its ohmic contact region 86, as shown in FIG. 4. This channel stop enhances the base's control of lateral current flow. FIG. 4 also illustrates that the upper surface of the bipolar junction transistor 22 is conventionally covered by a thick layer of field oxide 112.

Integrated circuits typically require several supply voltages for their operation. However, only a single external voltage is often supplied for various reasons, e.g., a limited number of external ports, the extra cost of external supplies and use of the circuit for portable, battery-powered operation. In these cases, additional supply voltages are generally generated with on-circuit generators in the form of space-efficient charge pumps, which are circuits that are composed only of switches and capacitors. Charge pumps are typically configured to use a "pump capacitor" to charge a "reservoir capacitor" from an available voltage supply. The reservoir capacitor is effectively converted into a source of different voltage. Charge pumps typically generate a voltage which is a multiple of their supply voltage, e.g., twice the voltage as in the case of the doubler 42.

In contrast to typical ESD protection circuits, the present invention recognizes that ESD current paths must reach external voltage supply ports to safely conduct the ESD energy away from sensitive circuits. Merely providing a current path into the integrated circuit substrate may not provide sufficient ESD protection. In particular, the presence of on-circuit voltage generators such as the doubler 62 must be taken into account. In the exemplary integrated circuit 40, the substrate 72 must be reverse biased by connecting it to the most positive circuit voltage, which is the output of the doubler 62. An ESD current path into the substrate must also contain a path portion which leads around the doubler 62 to an external voltage supply port.

The operation of the protection circuit 20 will now be described with respect to its reaction to an ESD event. Accordingly, FIG. 2 shows a probe 120 which has a capacitor 122 that has been charged to a predetermined event voltage $V_E$. The capacitor 122 can discharge itself through a series inductor 124 and resistor 126. For example, the probe 120 can present the protection circuit 20 with a positive HBM event if the capacitor 122 is charged to 1000 volts with the polarity shown in FIG. 2. If the capacitor value is 100 picofarads, the inductor value is zero and the resistor value is 1500 ohms. A negative event can be simulated by charging the capacitor 122 in the reverse polarity.

Although ESD events can be applied to circuits in both powered and unpowered states, it is assumed in the following description that a $V_{CC}$ of 5 volts has been applied to the circuit 40. Therefore, the output of the doubler charge pump is $2V_{CC}=10$ volts. For proper operation, all semiconductor junctions that are shared by the substrate 72 must be reverse biased. Because the substrate 72 is n-type, the most positive bias voltage of the integrated circuit 40 must be applied to the substrate 72. Therefore, in FIG. 1 the substrate 72 is biased at $2V_{CC}$ by connections to the doubler output 63 through the channel stops 98 and the collector 78.

The positive HBM event begins with the application of the probe tip 128 to the pad 60 (or, equivalently the external port 42 of FIG. 1). The applied voltage breaks down the emitter-base junction of the transistor 22 and current flows outward across the forward-biased base-collector junction. The breakdown voltage of the emitter-base junction is primarily set by the selected doping concentration levels of the transistor (this relationship between breakdown voltages and doping concentrations is well known in the integrated circuit art). For illustrative purposes, it is assumed that the breakdown voltage is 40 volts.

As the voltage on the pad 60 continues to rise, the voltage at the collector follows but at a potential that is ~40.7 volts lower (40 plus the forward-biased base-collector junction). As the voltage rises further, avalanche breakdown occurs between the drain 92 and source 93 of the MOS transistor 24 and current flows along the paths 28 and 30 of FIG. 1 to the external port 44. The breakdown voltage across the MOS transistor 24 is a function of its gate length and its doping concentration levels (these relationships between breakdown voltages and gate lengths and doping concentrations are also well known in the integrated circuit art).

If it is assumed for descriptive purposes that the breakdown voltage is 15 volts, then the substrate 72 is substantially clamped at +15 volts and the pad 60 is substantially clamped at +55.7 volts. The ESD peak current along the paths 28 and 30 will be substantially (1000−55.7)/1500=630 milliamps, which declines with a time constant of 150 nanoseconds. The peak instantaneous power dissipated in the resistor 70 would be (55.7)2/5000=620 milliwatts, which is safely within the capability of thin film resistors for the short time period of the event.

The bipolar transistor 22 and MOS transistor 24 must be configured with sufficient area to be able to safely carry this event current and dissipate the consequent heating. In addition, they are preferably configured to evenly spread the flow of this current, e.g., the bipolar junction transistor 22 has a collector 78 which is arranged without sharp corners and the MOS transistor 24 has sufficient current-carrying, cross-sectional area in its p-well 90, drain 92, source 83 and ohmic contact 91. Energy concentration problems in the MOS transistor 24 are less severe than in the bipolar junction transistor 22 because of the lower potential drop across the former device. The current path 28 includes lateral portions through the collector 78 as indicated in FIG. 4. During the positive ESD event, the drain 92 of the MOS transistor 24 (and the substrate 72) was clamped at +15 volts. Therefore, the MOS transistor 25 did not carry any current because the voltage across it (15−$V_{CC}$=10 volts) was not sufficient to place it into breakdown. However, voltage drops across bulk areas, e.g., the p-well of the transistor 24, may instantaneously exceed 5 volts and, in that case, MOS transistor 25 would also momentarily breakdown and share a portion of the ESD current.

In a negative ESD event (with $V_{CC}$ applied to the circuit 40), the polarity of the charge across the capacitor 122 of the probe 120 is reversed. In this case, the base-collector junction of the bipolar junction transistor 22 will be broken down. This breakdown is a function of the space 80. It is assumed for descriptive purposes, that this breakdown voltage is 40 volts and the initial voltage on the substrate 72 is 10 volts. As the voltage on the pad 60 is pulled negative, the emitter-base junction of the transistor 22 is forward biased and the base-collector junction is reverse biased. As the voltage on the pad 60 increases negatively, the reverse-breakdown voltage of the base-collector junction is reached. At this point, there is a 40 volt differential across the base-collector junction and 0.7 volt differential across the emitter-base junction. Because the voltage on the substrate 72 is still 10 volts at this time, the voltage on the pad 60 is 10−40.7=−30.7 volts.

As the ESD event continues to pull the pad 60 in a negative direction, the voltage on the substrate 72 decreases from its initial 10 volts. This will continue until the drain 92 of the MOS transistor 24 is forward biased relative to the transistor's p-well 90, which is connected to ground (through the voltage supply port 44). This process required the substrate 72 to decrease from 10 volts to −0.7 volts, i.e., a voltage movement of 10.7 volts. Therefore, the voltage on the pad 60 is clamped at −41.4 volts.

The ESD current flows along the paths 28 and 30 of FIG. 1. The initial current will be substantially (1000−41.4)/1500=639 milliamps, and then decline with a time constant of 150 nanoseconds. The peak instantaneous power dissipated in the resistor 70 would be (41.4)²/5000=343 milliwatts, which is less than the corresponding value for a positive event. The MOS transistor 24 will not carry any current unless there is enough bulk resistance voltage drop to bring the substrate 72 below −0.7 volt.

These positive and negative ESD events can be repeated with the capacitor 122 of the probe 120 referenced to $V_{CC}$ rather than to ground. The reaction of the protection network 20 is substantially the same as that described above.

Additional ESD events can occur due to voltage spikes that are picked up on the external power supply ports 43 and 44. This can be simulated by applying the tip 128 of the probe 120 alternately to these ports (essentially this is an application of the charged device model). In this type of event, the discharge current is safely conducted by the MOS transistor 26 along the path 130 between the supply ports 43 and 44. All of the MOS transistors 24, 25 and 26 are restrained from inadvertent turn-on during normal circuit operation because their resistors 27 maintain their gates and drains at the same potential.

In an exemplary use of the protection network 20, the circuit 46 is an RS-232C interface which is intended to couple two portable pieces of equipment, e.g., a laptop computer and a portable printer. In this case, the circuit 46 would provide two parallel receiver/driver paths to allow two-way data communications between the computer and the printer. The buffer 50 would be part of one of these data paths. In this example of portable equipment, the voltage supply for the circuit 46 is preferably supplied by a battery so that only one external voltage is available and the doubler 62 supplies an additional voltage for operation of the interface circuits.

In an exemplary realization of the protection circuit 20, a base-emitter junction breakdown voltage for the transistor 22 of ~40 volts could be obtained with carrier concentration levels in the range of $1 \times 10^{16} cm^{-3}$ to $5-10^{17} cm^{-3}$ in the base and emitter. Although the base-collector junction breakdown voltage is dependant upon the particular transistor layout, a breakdown voltage of ~40 volts would generally require a space 80 between the base 76 and the collector 78 in the range of 8 to 12 microns. Although the breakdown voltage of the MOS transistors is a function of gate length, a breakdown of ~15 volts would generally be obtained with drain and source carrier concentration levels on the order of $1 \times 10^{20} cm^{-3}$ and p-well carrier concentration levels on the order of $1.5 \times 10^{16} cm^{-3}$. Exemplary implant depths are 1 micron for the drains 92 and sources 93, 2 microns for the channel stops 98 and 6 microns for the p-wells 90.

Although the invention has been illustrated with reference to the protection of a thin film resistor, e.g., resistor 70 of FIG. 1, it is also applicable to the protection of other sensitive circuit elements. For example, some circuits couple external signal ports directly to the gate of an MOS buffer. In this case the thin gate oxide, e.g., the gate oxide 96 of MOS transistor 24, may be ruptured by large electrostatic voltages.

The invention has been illustrated with reference to an embodiment which has a first positive supply voltage, a second positive supply voltage generated from the first voltage, an n-type substrate, n-MOS transistors in p-type wells and an n-p-n bipolar junction transistor but other embodiments of the invention can easily be envisioned. For example, another embodiment may have a first negative supply voltage, a second negative supply voltage generated from the first voltage, a p-type substrate, n-MOS transistors and a p-n-p bipolar junction transistor whose collector is a p-type channel stop in the substrate. In this embodiment, the substrate is connected to the most negative circuit potential. This latter embodiment could also employ p-MOS transistors in n-type wells but n-MOS transistors are generally preferred because of their higher carrier mobility.

Figure 5:
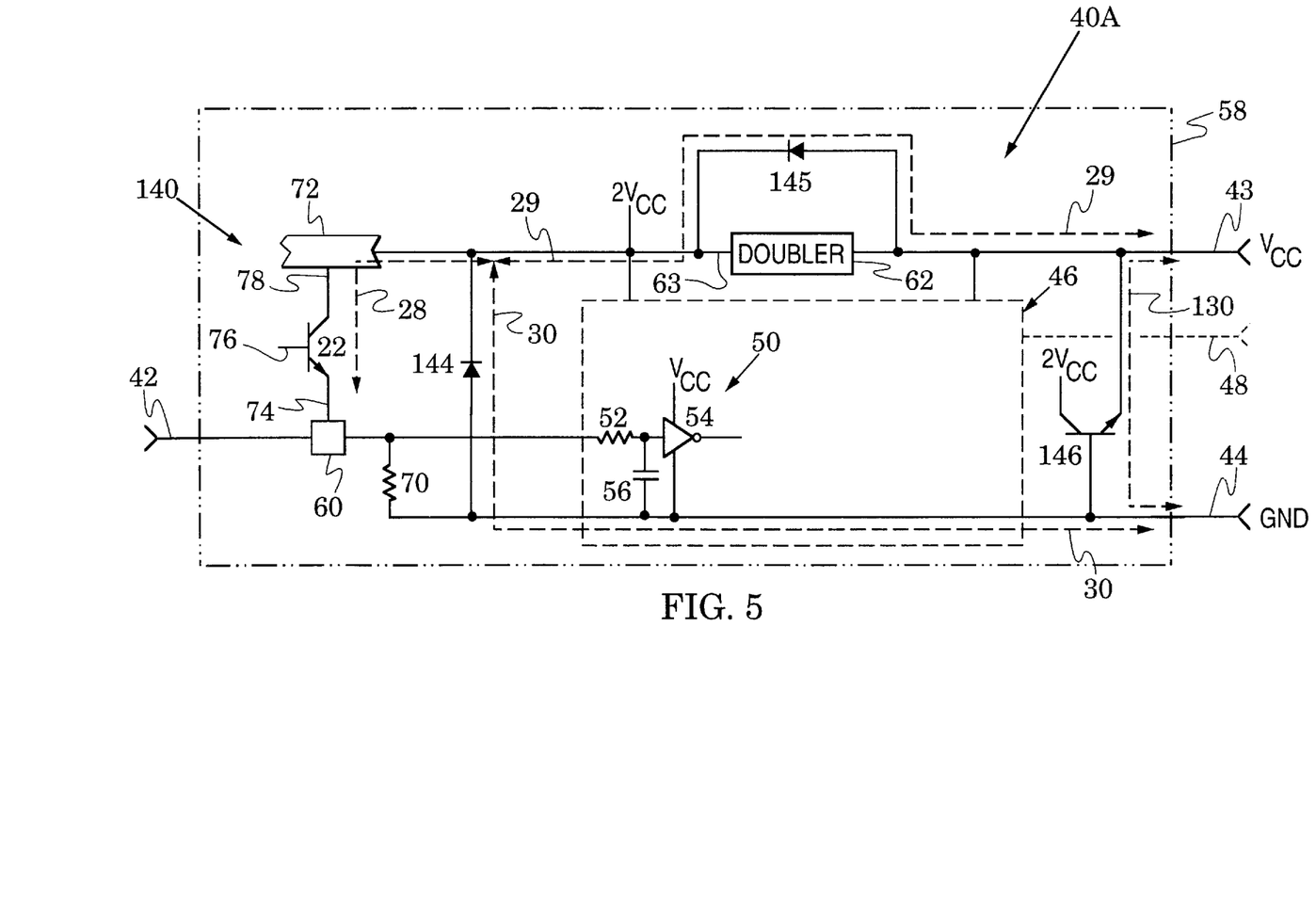
FIG. 5 is a schematic of an integrated circuit which includes another ESD protection network in accordance with the present invention.

Another embodiment of the invention is shown in the protection network 140 of FIG. 5. FIG. 5 is similar to FIG.

1 with like elements represented with like reference numbers (the integrated circuit 40 is referenced as 40A to reflect the changes in the protection network). This embodiment employs different semiconductor devices to obtain the conduction paths 29, 30 and 130. In particular, the MOS transistors 24 and 25 are respectively replaced with diodes 144 and 145 and the MOS transistor 26 is replaced with a bipolar transistor 146.

The diodes 144 and 146 can be easily formed in a "spot diode" process in which a $p^{++}$ohmic contact is formed in the substrate 72. Preferably this ohmic contact is deposited into a $p^+$channel stop. Thus, the deposited structure of the diodes 144 and 146 would be similar to the ohmic contact 99 and channel stop 98 of FIG. 2 except they would be formed of p-type material. The transistor 146 has its emitter coupled to $V^{CC}$, its base coupled to GND at the voltage supply port 44, and its collector coupled to the most positive point of the circuit 40A which is the substrate at a potential of $2V^{CC}$. In operation, the diodes 144 and 145 are doped to have a predetermined breakdown voltage, e.g., 15 volts, in a positive ESD event. They are simply forward biased in a negative ESD event. Similarly, the base-emitter juction of the transistor 146 is doped to have a predetermined breakdown voltage in a positive ESD event across the voltage supply ports 43 and 44. The junction is forward biased in a negative ESD event across these ports.

Thus, the diodes 145 and 144 provide respective conduction paths 29 and 30 between the substrate 72 and the first voltage supply port 43 and between the substrate 72 and the second voltage supply port 44. The transistor 146 provides a conduction path 130 between the first voltage supply port 43 and the second voltage supply port 44.

Although the response times of the diodes 144 and 145 of FIG. 5 may be slightly slower than that of the MOS transistors 24 and 25 of FIG. 1, they may use less substrate area for a predetermined current-carrying capability.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

I claim:

1. A protection network for protecting a circuit from positive and negative electrostatic discharges at an external port of said circuit, said circuit having first and second voltage supply ports for the application of a supply voltage, the network comprising:
   a substrate which carries said circuit, said external port and said first and second voltage supply ports, said substrate formed of a selected one of n-type semiconductor material and p-type semiconductor material with said substrate coupled to said first voltage supply port;
   a conduction path for discharging bidirectional currents between said external port and said second voltage supply port, said conduction path including:
      a) a bipolar junction transistor positioned in said substrate, said transistor having an emitter coupled to said external port, an open-circuited base positioned between said emitter and said substrate and a collector configured of said selected semiconductor material and arranged in said substrate to surround said base and be laterally spaced from said base by a space which is selected to obtain a predetermined collector-base breakdown voltage, said emitter and said base each having a doping concentration which is selected to obtain a predetermined emitter-base breakdown voltage, said bipolar junction transistor thereby providing a conduction path portion between said external port and said substrate in response to said positive and negative electrostatic discharges;
      b) an MOS transistor positioned in said substrate to provide a conduction path portion between said substrate and said second voltage supply port in response to said positive and negative electrostatic discharges; and
      c) a conduction path portion of said substrate which connects said collector and said MOS transistor.

2. The protection network of claim 1, wherein said space is substantially in the range of 8 to 12 microns.

3. The protection network of claim 1, wherein: said MOS transistor includes a source and a drain; and
   one of said source and drain is connected to said substrate and the other is connected to said second voltage supply port.

4. The protection network of claim 3, wherein said MOS transistor includes a gate and said protection network further includes a resistor arranged to couple said gate and said drain to prevent current conduction of said MOS transistor during normal operation of said circuit.

5. The protection network of claim 1, further including a semiconductor well separating said MOS transistor and said substrate wherein said well and said base are of the same dopant-type semiconductor.

6. The protection network of claim 1, further including a second MOS transistor positioned in said substrate and arranged to provide a conduction path between said first and second voltage supply ports in response to said positive and negative electrostatic discharges.

7. A protection network for protecting a circuit from positive and negative electrostatic discharges at an external port of said circuit, said circuit having first and second voltage supply ports for the application of a first supply voltage, the network comprising:
   a substrate which carries said circuit, said external port and said first and second voltage supply ports, said substrate formed of a selected one of n-type semiconductor material and p-type semiconductor material with said substrate coupled to said first voltage supply port; and
   a conduction path from said external port for discharging bidirectional currents through said second voltage supply port, said conduction path including:
      a) a bipolar junction transistor positioned in said substrate, said transistor having an emitter coupled to said external port, an open-circuited base positioned between said emitter and said substrate and a collector configured of said selected semiconductor material and arranged in said substrate to surround said base and be laterally spaced from said base by a space which is selected to obtain a predetermined collector-base breakdown voltage, said emitter and said base each having a doping concentration which is selected to obtain a predetermined emitter-base breakdown voltage, said bipolar junction transistor thereby providing a conduction path portion between said external port and said substrate in response to said positive and negative electrostatic discharges;
      b) a semiconductor diode having an anode and a cathode and positioned in said substrate with its anode coupled to said second voltage supply port to provide a conduction path portion between said substrate and said second voltage supply port in response to said positive and negative electrostatic discharges; and c) a conduction path portion of said substrate which connects said collector and said semiconductor diode.

8. The protection network of claim 7, further including a second semiconductor diode positioned in said substrate and arranged to provide a conduction path between said first and second voltage supply ports in response to said positive and negative electrostatic discharges.

9. The protection network of claim 7, wherein said space is substantially in the range of 8 to 12 microns.

10. A protection network for protecting a circuit from positive and negative electrostatic discharges at an external port of said circuit, said circuit having first and second voltage supply ports for the application of a first supply voltage and a voltage generator coupled to said first voltage supply port for generating a second supply voltage at a generator output, the network comprising:

a substrate which carries said circuit, said external port, said first and second voltage supply ports and said voltage generator, said substrate formed of a selected one of n-type semiconductor material and p-type semiconductor material with said substrate coupled to said generator output;

a first conduction path from said external port for discharging bidirectional currents through said first voltage supply port, said first conduction path including:

a) a bipolar junction transistor positioned in said substrate, said transistor having an emitter coupled to said external port, an open-circuited base positioned between said emitter and said substrate and a collector configured of said selected semiconductor material and arranged in said substrate to surround said base and be laterally spaced from said base by a space which is selected to obtain a predetermined collector-base breakdown voltage, said emitter and said base each having a doping concentration which is selected to obtain a predetermined emitter-base breakdown voltage, said bipolar junction transistor thereby providing a conduction path portion between said external port and said substrate in response to said positive and negative electrostatic discharges;

b) a first MOS transistor positioned in said substrate to provide a conduction path portion around said voltage generator and between said substrate and said first voltage supply port in response to said positive and negative electrostatic discharges; and c) a first conduction path portion of said substrate which connects said collector and said first MOS transistor;

and a second conduction path from said external port for discharging bidirectional currents through said second voltage supply port, said second conduction path including:

a) said bipolar junction transistor which provides a conduction path portion between said external port and said substrate in response to said positive and negative electrostatic discharges;

b) a second MOS transistor positioned in said substrate to provide a conduction path portion between said substrate and said second voltage supply port in response to said positive and negative electrostatic discharges; and c) a second conduction path portion of said substrate which connects said collector and said second MOS transistor.

11. The protection network of claim 1, wherein said space is substantially in the range of 8 to 12 microns.

12. The protection network of claim 1, wherein:

said first and second MOS transistors each includes a source and a drain;

one of said source and drain of said first MOS transistor is connected to said substrate and the other is connected to said first voltage supply port; and one of said source and drain of said second MOS transistor is connected to said substrate and the other is connected to said second voltage supply port.

13. The protection network of claim 12, wherein each of said first and second MOS transistors includes a gate and said protection network further includes, for each of said MOS transistors, a resistor arranged to couple said gate and said drain to prevent current conduction of the MOS transistor during normal operation of said circuit.

14. The protection network of claim 12, further including, for each of said MOS transistors, a semiconductor well separating said MOS transistor and said substrate wherein said well and said base are of the same dopant-type semiconductor.

15. The protection network of claim 12, further including a third MOS transistor positioned in said substrate and arranged to provide a conduction path between said first and second voltage supply ports in response to said positive and negative electrostatic discharges.

16. A protection network for protecting a circuit from positive and negative electrostatic discharges at an external port of said circuit, said circuit having first and second voltage supply ports for the application of a first supply voltage and a voltage generator coupled to said first voltage supply port for generating a second supply voltage at a generator output, the network comprising:

a substrate which carries said circuit, said external port and said first and second voltage supply ports, said substrate formed of a selected one of n-type semiconductor material and p-type semiconductor material with said substrate coupled to said generator output;

a first conduction path from said external port for discharging bidirectional currents through said first voltage supply port, said first conduction path including:

a) a bipolar junction transistor positioned in said substrate, said transistor having an emitter coupled to said external port, an open-circuited base positioned between said emitter and said substrate and a collector configured of said selected semiconductor material and arranged in said substrate to surround said base and be laterally spaced from said base by a space which is selected to obtain a predetermined collector-base breakdown voltage, said emitter and said base each having a doping concentration which is selected to obtain a predetermined emitter-base breakdown voltage, said bipolar junction transistor thereby providing a conduction path portion between said external port and said substrate in response to said positive and negative electrostatic discharges;

b) a first semiconductor diode having an anode and an cathode and positioned in said substrate with its anode coupled to said first voltage supply port to provide a conduction path portion around said voltage generator and between said substrate and said first voltage supply port in response to said positive and negative electrostatic discharges; and c) a first conduction path portion of said substrate which connects said collector and said first semiconductor diode;

and a second conduction path from said external port for discharging bidirectional currents through said second voltage supply port, said second conduction path including:
  a) said bipolar junction transistor which provides a conduction path portion between said external port and said substrate in response to said positive and negative electrostatic discharges;
  b) a second semiconductor diode having an anode and a cathode and positioned in said substrate with its anode coupled to said second voltage supply port to provide a conduction path portion between said substrate and said second voltage supply port in response to said positive and negative electrostatic discharges; and
  c) a second conduction path portion of said substrate which connects said collector and said second semiconductor diode.

17. The protection network of claim 16, wherein said space is substantially in the range of 8 to 12 microns.

18. The protection network of claim 16, further including a bipolar transistor positioned in said substrate and arranged to provide a conduction path between said first and second voltage supply ports in response to said positive and negative electrostatic discharges.

\* \* \* \* \*